(12) United States Patent
Chen et al.

(10) Patent No.: US 6,303,501 B1
(45) Date of Patent: Oct. 16, 2001

(54) GAS MIXING APPARATUS AND METHOD

(75) Inventors: Chen-An Chen, Sunnyvale, CA (US); Koji Nakanishi, Tokyo (JP); Aihua Chen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/550,448

(22) Filed: Apr. 17, 2000

(51) Int. Cl.$^7$ ................................................ H01L 21/44
(52) U.S. Cl. ..................... 438/680; 438/670; 438/610; 137/3; 137/88; 137/607; 137/624
(58) Field of Search ................... 438/680; 137/3, 137/88, 624.2, 607; 23/232, 254

(56) References Cited

U.S. PATENT DOCUMENTS

| | | | |
|---|---|---|---|
| 4,111,402 | 9/1978 | Barbini | 138/38 |
| 4,113,434 | * 9/1978 | Tanaka et al. | 23/232 R |
| 4,514,095 | 4/1985 | Ehrfeld et al. | 138/38 |
| 4,526,188 | * 7/1985 | Olsson et al. | 137/3 |
| 4,936,689 | 6/1990 | Federighi et al. | 138/42 |
| 5,038,711 | * 8/1991 | Dan et al. | 118/715 |
| 5,227,331 | * 7/1993 | Westmoreland | 437/174 |
| 5,558,910 | 9/1996 | Telford et al. | 427/255 |
| 5,895,530 | 4/1999 | Shrotriya et al. | 118/715 |

OTHER PUBLICATIONS

Internal Paper Presented at Applied Materials Engineering and Technology Conference, Jul. , 1997.
PH Conductivity Handbook, Omega Catalog, vol. 29 (1997).

* cited by examiner

*Primary Examiner*—Amir Zarabian
*Assistant Examiner*—Pho Luu
(74) *Attorney, Agent, or Firm*—Townsend & Townsend & Crew (57) ABSTRACT

The present invention provides apparatus, systems, and methods related to the manufacture of integrated circuits. Specifically, embodiments of the present invention include apparatus designed to provide thorough and reliable fluid mixture for gases used in a semiconductor processing system. In one embodiment of the invention, the gas mixing apparatus comprises a gas mixer housing having a gas inlet, a fluid flow channel, and a gas outlet. The fluid flow channel is fluidly coupled to a plurality of gas sources. The majority of the gas mixture occurs in the fluid flow channel which comprises one or more fluid separators for separating the gas into two or more gas portions and one or more fluid collectors for allowing the gas portions to collide with each other to mix the gas portions. This separation and collection of the gas portions results in a thoroughly mixed gas.

23 Claims, 12 Drawing Sheets

GAS MIXING APPARATUS AND METHOD

This application claims priority from U.S. Pat. application Ser. No. 08/893,414, filed Jul. 11, 1997, now U.S. Pat. No. 6,068,703, the disclosure of which is incorporated by reference.

BACKGROUND OF THE INVENTION

The present invention relates to the manufacture of integrated circuits. In particular, the present invention is directed to apparatus, systems, and methods for thoroughly mixing a plurality of gases to be used in a semiconductor wafer manufacturing process. More particularly, the present invention relates to thorough gas mixing for the formation of polycide films using. materials such as tungsten silicide ($WSi_x$) on a semiconductor wafer.

Semiconductor device geometries have dramatically decreased in size since such devices were first introduced several decades ago. Since then, integrated circuits have generally followed the two-year/half-size rule (often called "Moore's Law") which means that the number of devices which will fit on a chip doubles every two years. Today's wafer fabrication plants are routinely producing 0.5 $\mu$m and even 0.35 $\mu$m feature size devices, and tomorrow's plants soon will be producing devices having even smaller feature sizes.

One of the primary steps in fabricating modern semiconductor devices involves the formation of a dielectric, metal, or insulating layers over a semiconductor substrate. As is well known, such layers can be deposited by chemical vapor deposition (CVD). CVD processes are particularly suitable for use with high integration devices because CVD layers provide superior step coverage and post-annealing qualities to those layers formed by sputtering or other conventional deposition methods. In a conventional thermal CVD process, reactive gases are supplied to the substrate surface where heat-induced chemical reactions (homogeneous or heterogeneous) take place to produce a desired film. In a plasma enhanced chemical vapor deposition (PECVD) process, the flowing gas may be excited to a plasma state. A controlled plasma is formed to decompose and/or energize reactive species to produce the desired film. The process of depositing layers on a semiconductor wafer (or substrate) usually involves heating the substrate and holding it a short distance from the source of a stream of deposition (or process) gas flowing towards the substrate. In general, reaction rates in thermal and plasma processes may be controlled by controlling one or more of the following: temperature, pressure, and reactant gas characteristics.

In the quest to achieve ever smaller devices, increasingly stringent process requirements are being imposed on integrated device manufacturing processes. One such requirement is the thorough mixture of process gases prior to introduction of the gases into a CVD chamber. A thorough mixture of the process gases is typically necessary to achieve a uniform deposition pattern on the semiconductor substrate. If the quality of the mixing achieved by the plurality of gases is insufficient, the CVD process using the gases will provide an uneven deposition pattern, which may result in variance of the sheet resistance of the deposited film, delamination during annealing, or other undesirable qualities which may degrade device performance.

A thorough gas mixre is particularly desirable in the formation of a tungsten silicide ($WSi_x$) film. To overcome heat generation and heat dissipation problems associated with using conventional polysilicon films and scaled down device dimensions, "polycide" films using tungsten silicide have been formed by depositing a metal silicide layer over a layer of conventional polysilicon. Such polycide films have lower resistivities than polysilicon films and thus reduce heat generation and heat dissipation problems. The preferred method for forming tungsten silicide layers comprises chemical vapor deposition (CVD) of dichlorosilane (DCS) and tungsten hexafluoride ($WF_6$) over a semiconductor substrate.

Unfornmately, despite the improved film characteristics of the DCS and $WF_6$ process, the CVD process using these two gases is particularly sensitive to gas flow and mixture parameters. Conventional gas mixers adapted to provide adequate levels of gas mixing are costly to manufacture and sensitive to minor flaws associated with manufacturing. Conventional mixers typically only use one mixing step and rely on a mixer that is difficult to test prior to actual use in a semiconductor system. Hence, it would be desirable to provide an improved gas mixing apparatus that would provide reliable and thorough gas mixing. It would further be desirable to provide a gas mixing apparatus that facilitates manufacturing and would be less sensitive to minor flaws that may occur during manufacturing.

SUMMARY OF THE INVENTION

The present invention is related to semiconductor wafer processing. More specifically, the present invention is directed to apparatus, systems, and methods for reliable and thorough gas mixing. The present invention uses a mixing procedure that is more tolerant of flaws which may occur during manufacturing and thus increases the robustness of the resulting gas mixing apparatus. Due in part to the design associated with this improved gas mixing apparatus, the present invention allows for easier access to portions of the apparatus involved in fluid mixing. This facilitates manufacturing and also improves device testing prior to installation of the gas mixing apparatus into a wafer processing system.

According to the present invention, a gas mixing apparatus for use with a semiconductor wafer processing chamber comprises a gas mixer housing having a gas inlet for fluidly coupling to a plurality of gas sources. The housing includes a fluid flow channel fluidly coupled to the gas inlet. The fluid flow channel comprises one or more fluid separators for separating the gas into two or more gas portions and one or more fluid collectors for allowing the gas portions to collide with each other to combine and form a mixed gas. The mixed gas exits the mixing apparatus through a gas outlet fluidly connected to the fluid flow channel, typically for flowing the mixed gas into a processing chamber. The fluid flow channel can allow for repeated separating and colliding of the gas portions to ensure a more complete gas mixture.

In one embodiment of the gas mixing apparatus, the fluid separators comprise a first carrier channel having a channel surface that redirects the process gases into two or more gas portions flowing away from one another in the channel. The fluid collector comprises an impinging channel that intersects the first carrier channel at a location where a plurality of gas portions are colliding. The impinging channel may then further intersect a second carrier channel to release the mixed gas into the second carrier channel which separates the mixed gas into a plurality of gas portions.

In further embodiments of the gas mixing apparatus, the fluid flow channel of the gas mixer housing may be provided on an insert slidably fitted within an insert recess of the housing. Having the channel on a removable insert simplifies manufacturing of the fluid flow channel and also facilitates inspection of the part. The fluid flow channel is typically incorporated on the surface of the insert. In certain embodiments, the insert may also be attached to a portion of the housing in the form of a protrusion. In this embodiment, the present invention provides a gas mixer housing comprising a first portion and a second portion. The first portion has a protrusion incorporating the fluid flow channel on the surface of the protrusion and the second portion has a protrusion recess for slidably receiving the protrusion.

In still further embodiments of the gas mixing apparatus, the fluid flow path may be provided directly on the gas mixer housing. In this embodiment, the gas mixer housing comprises a first portion and a second portion where the fluid flow channel is incorporated on the surface of the second portion. This allows a fluid flow channel to be formed in the housing without the use of an insert. The flow channel remains accessible to inspection as the portions of the housing may be separated from one another.

According to the present invention, a method for fabricating an integrated circuit device comprises the step of flowing a plurality of gases into the gas mixer. The plurality of gases are separated into two or more gas portions. The gas portions collide with each other and cause gas mixing. The resulting gas mixture or mixed gas flows into the processing chamber onto a semiconductor wafer. Typically, within the chamber, the mixed gas is heated to form a layer of deposition material on the semiconductor wafer.

These and other embodiments of the present invention, as well as its advantages and featrs, are described in more detail in conjunction with the text below and attached figures.

DETAILED DESCRIPTION OF THE SPECIFIC EMBODIMENTS

I. Introduction

The present invention allows for the mixture of a plurality of gases for use in semiconductor wafer processing. In particular, the invention allows for uniform deposition of a tungsten silicide film by introducing and thoroughly mixing a tungsten containing gas, such as tungsten hexafluoride ($WF_6$), with a silicon source gas such as dichlorosilane (DCS) prior to sending the mixture into a. chemical vapor deposition (CVD) chamber. Details on a suitable method for forming a tungsten silicide film may be found in commonly assigned, co-pending application Ser. No. 08/764,471, filed Dec. 12, 1996, the complete disclosure of which is incorporated herein by reference. Films deposited by such methods may be used for fabricating integrated circuits having feature sizes of 0.35 microns or less. The present invention can be used to deposit tungsten silicide films in CVD chambers of conventional design.

II. Overview of a Representative CVD Apparatus

Figure 1:
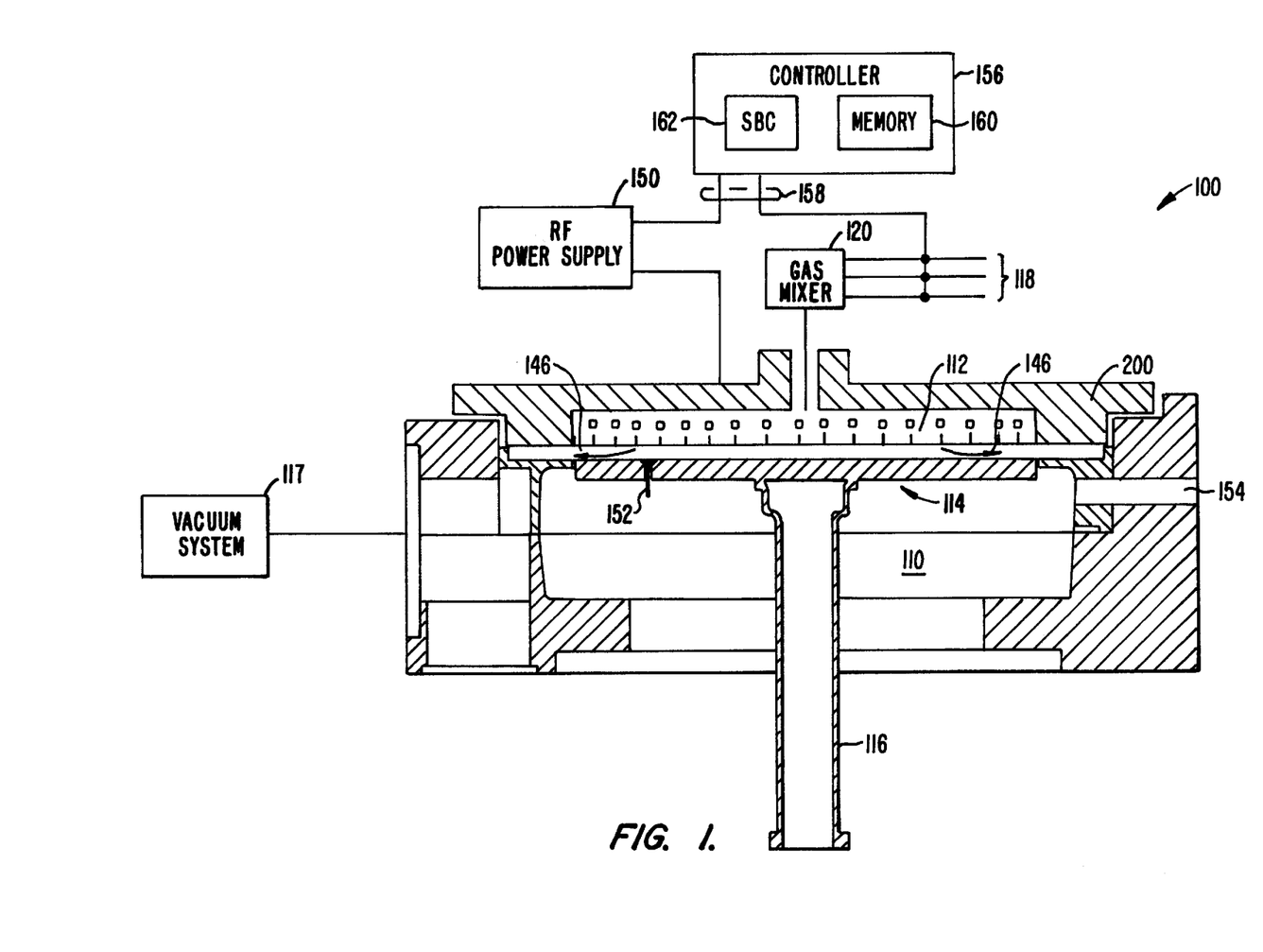
FIG. 1 is a schematic illustration of a representative CVD system for use with the present invention.

FIG. 1 shows a simplified, representative CVD system 100 for use with the present invention. The system 100 comprises a CVD processing chamber 110 in which a deposition material such as a tungsten silicide layer can be deposited on a semiconductor wafer. The chamber 110 is typically a low pressure chamber such as a DCSxZ chamber as manufactured by Applied Materials, Santa Clara, Calif. CVD processing chamber 110 includes a gas distribution manifold 112 for dispersing process gases through perforated holes in manifold 112 to a wafer that rests on a suseptor or pedestal 114 in the chamber. Pedestal 114 typically contains a resistive heating coil embedded in the pedestal to provide a desired processing temperature necessary for forming deposition layers on a wafer substrate. Susceptor 114, as shown in FIG. 1, is in an upper processing position which is closely adjacent to manifold 112. Positioning mechanisms (not shown) controllably move susceptor 114 in support shaft 116 between lower loading/off loading position and the upper processing position for allowing deposition of process gasses. Motors and optical sensors are used to move and determine the position of movable mechanical assemblies such as the susceptor 114.

Figure 2A:
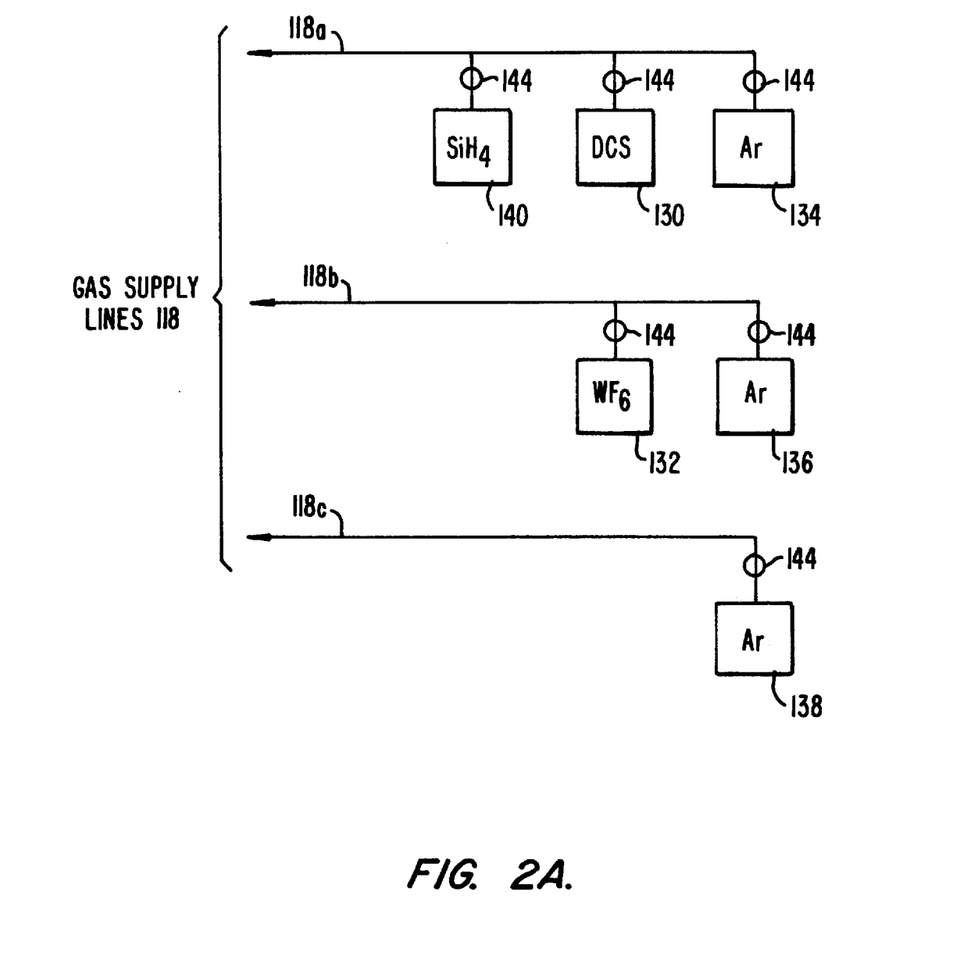
FIG. 2A is a schematic illustration of one embodiment of the source gases connected to the system of FIG. 1.

Deposition and carrier gasses are supplied through supply lines 118 into a gas mixing apparatus 120 where they are combined and then sent to manifold 112. It is possible, in certain situations, to direct deposition and carrier gasses directly from lines 118 to manifold 112. In such a case, the gas mixing apparatus 120 is by-passed. As shown in FIG. 1, gas supply lines 118 may comprise a plurality of supply lines fluidly coupled to a variety of gas sources. Referring to FIG. 2A, a first line 118A supplies a silicon containing gas (e.g., DCS from a DCS source 130) into gas mixing apparatus 120, while a second line 118B supplies $WF_6$ from a $WF_6$ source 132 into the gas mixing apparatus 120. For each line 118A and 118B, a carrier gas (e.g., argon from argon source 134 and 136) can be supplied with the process to stabilize gas flows as appropriate and to even the gas flow between the two lines into the gas mixing apparatus 120. Typically, a third gas supply line 118C introduce an inert purge gas (e.g., argon from an argon source 138) from the bottom of the chamber to keep deposition gases away from the area of the chamber below susceptor 114. In preferred embodiments, an additional silicon source (e.g., silane $SiH_4$) may be supplied from additional gas source 140.

Generally, supply lines 118 for each of the process gases include safety shutoff valves (not shown) that can be used to automatically or manually shut off the flow of process gas into the chamber, and mass flow controllers 144 that measure the flow of gas or liquid through the supply lines. The rate at which deposition and carrier gases are supplied to gas mixing apparatus 120 is controlled by liquid or gas mass flow controllers 144 and/or by valves. During processing, gas supplied to manifold 112 is vented toward and uniformly distributed radially across the surface of the wafer on the susceptor 114 in a laminar flow as indicated by arrows 146. An exhaust system then exhausts the gas from processing chamber 115 and out an exhaust line (not shown) by a vacuum pump system 117. The rate at which gases are released through an exhaust line is controlled by a throttle valve (not shown).

A deposition or subsequent cleaning process performed in CVD system 100 can be either a thermal process or a plasma-enhanced process. In a plasma process, a control plasma is formed adjacent to the wafer by RF energy applied to manifold 112 from RF power supply 150. Manifold 112 is also typically an RF electrode, while susceptor 114 is grounded. RF power supply 150 can supply either single or mixed frequency RF power (or other desired variation) to manifold 112 to enhance the decomposition of reactive species introduced into chamber 110. Cleaning processes often involve the introduction of an etching gas such as fluorine into the CVD chamber 110 and the gas mixing apparatus 120. An inert gas, such as argon, is typically flushed through the chamber and the mixer after the cleaning to purge etching gas from the system prior to wafer processing.

As noted earlier, a lift assembly and motor (not shown) raises and lowers the susceptor 114 and its wafer lift pins 152 as wafers are transferred into and out of the body of the chamber by a robot blade (not shown) through an insertion/removal opening 154 in the side of the chamber 110. The motor, valves or flow controllers connected to the supply lines 118, gas delivery system, throttle valve, RF power supply 150, and chamber and substrate heating systems are all controlled by a system controller 156 over control lines 158, of which only some are shown. Controller 156 relies on feedback from optical sensors to determine the position of movable mechanical assemblies such as the throttle valve and susceptor which are moved by appropriate motors under the control of controller 156.

In a preferred embodiment, the system controller includes a hard disk drive (memory 160), a floppy disk drive and a processor 162. The processor contains a single-board computer (SBC), analog and digital input/out boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 156 controls all of the activities of the CVD machine. The system controller executes system control software, which is a computer program stored in a computer-readable medium such as a memory 160. Preferably, memory 160 is a hard disk drive, but memory 160 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 156.

Figure 2B:
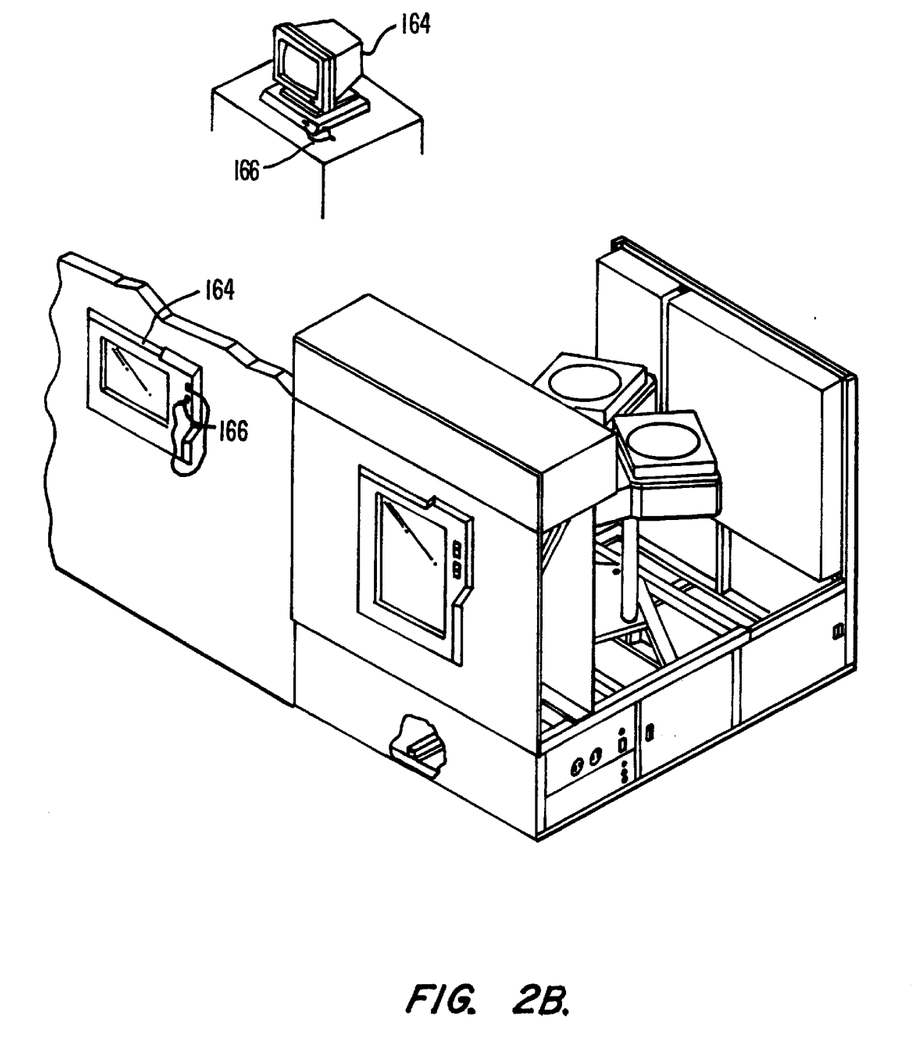
FIG. 2B is a perspective view of control equipment used with the system of FIG. 1.

The interface between a user and a controller 156 is via a CRT monitor 164 and light pen 166, shown in FIG. 2B, which is a simplified diagram of the system monitor and CVD system 100 in a substrate processing system, which may include one or more chambers. In the preferred embodiment two monitors 164 are used, one mounted in the clean room wall for the operators and the other behind the wall for the service technicians. The monitors 164 simultaneously display the same information, but only one light pen 166 is enabled. A light sensor in the tip of light pen 166 detects light emitted by CRT display. To select a particular screen or function, the operator touches a designated area of the display screen and pushes the button on the pen 166. The touched area changes its highlighted color, or a new menu or screen is displayed, confirming communication between the light pen and the display screen. Other devices, such as a keyboard, mouse, or other pointing or communication device, may be used instead of or in addition to light pen 166 to allow the user to communicate with controller 156.

The process for depositing the film can be implemented using a computer program product that is executed by controller 156. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ Library routines. To execute the linked, compiled object code the system user invokes the object code, causing the computer system to load the code in memory. The CPU then reads and executes the code to perform the tasks identified in the program.

The above apparatus description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in susceptor design, heater design, RF power frequencies, location of RF power connections and others are possible. For example, the wafer could be supported and heated by quartz lamps. The layer and method for forming such a layer with the present invention is not limited to any specific apparatus or to any specific plasma excitation method.

III. Gas Mixing Apparatus

Figure 3:
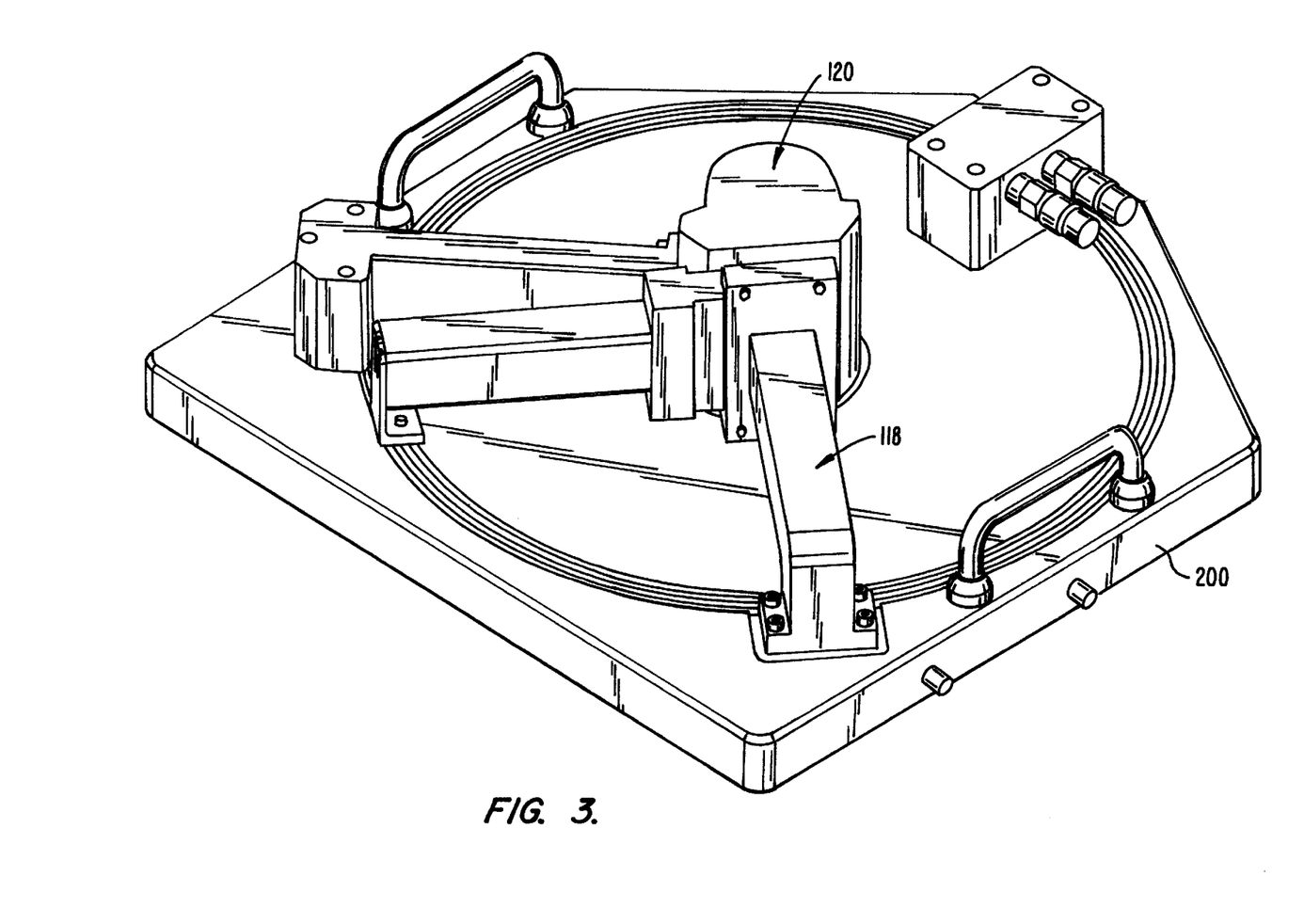
FIG. 3 is a perspective view of a CVD chamber lid having a gas mixing apparatus of the present invention.
Figure 4A:
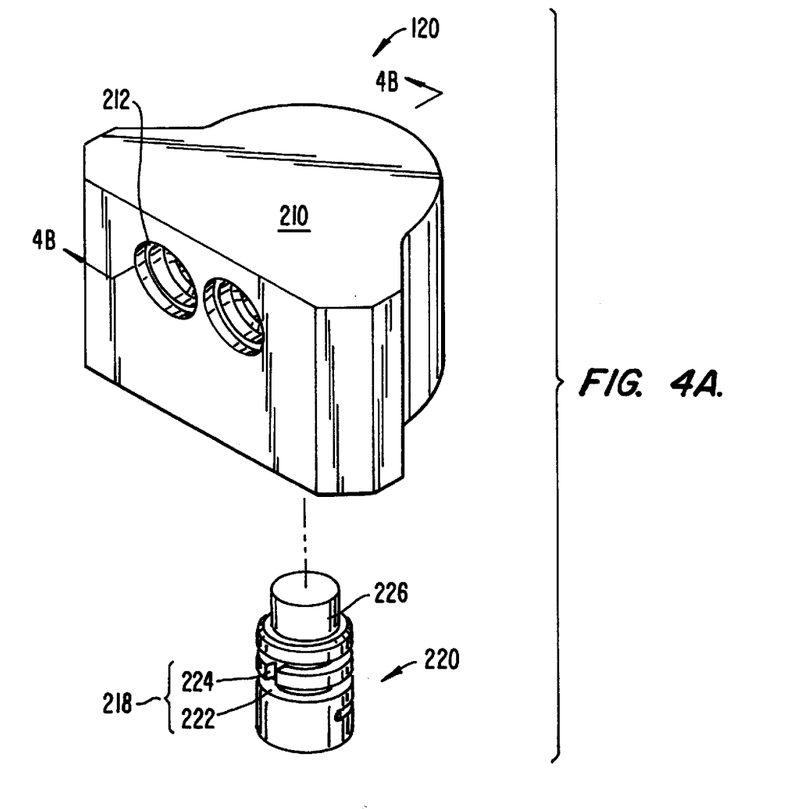
FIGS. 4A–4C depict a housing and insert of the gas mixing apparatus of the present invention.
Figure 4B:
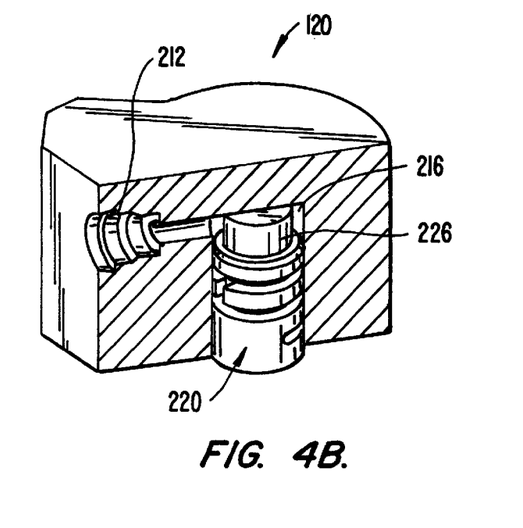
Figure 4C:
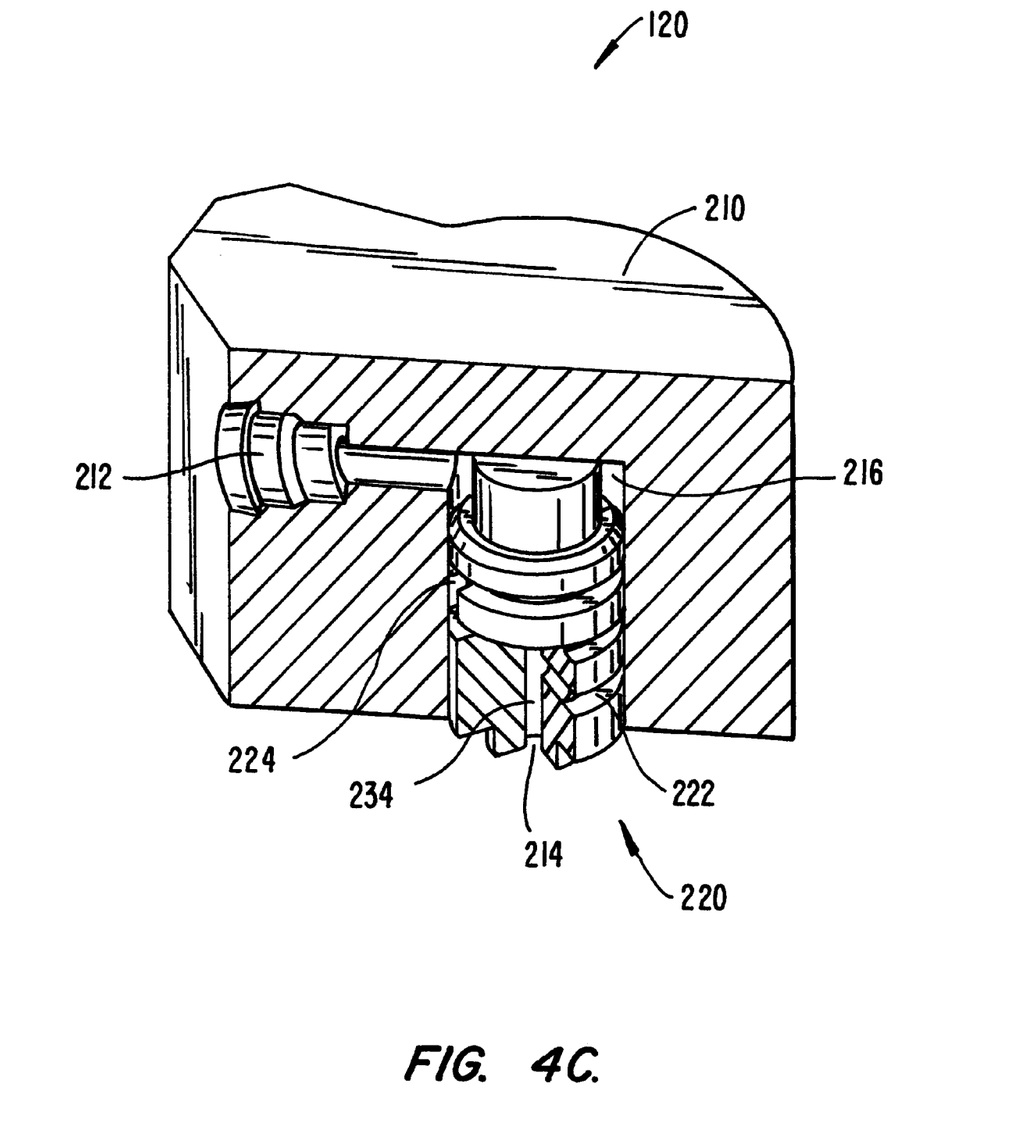
Figure 5:
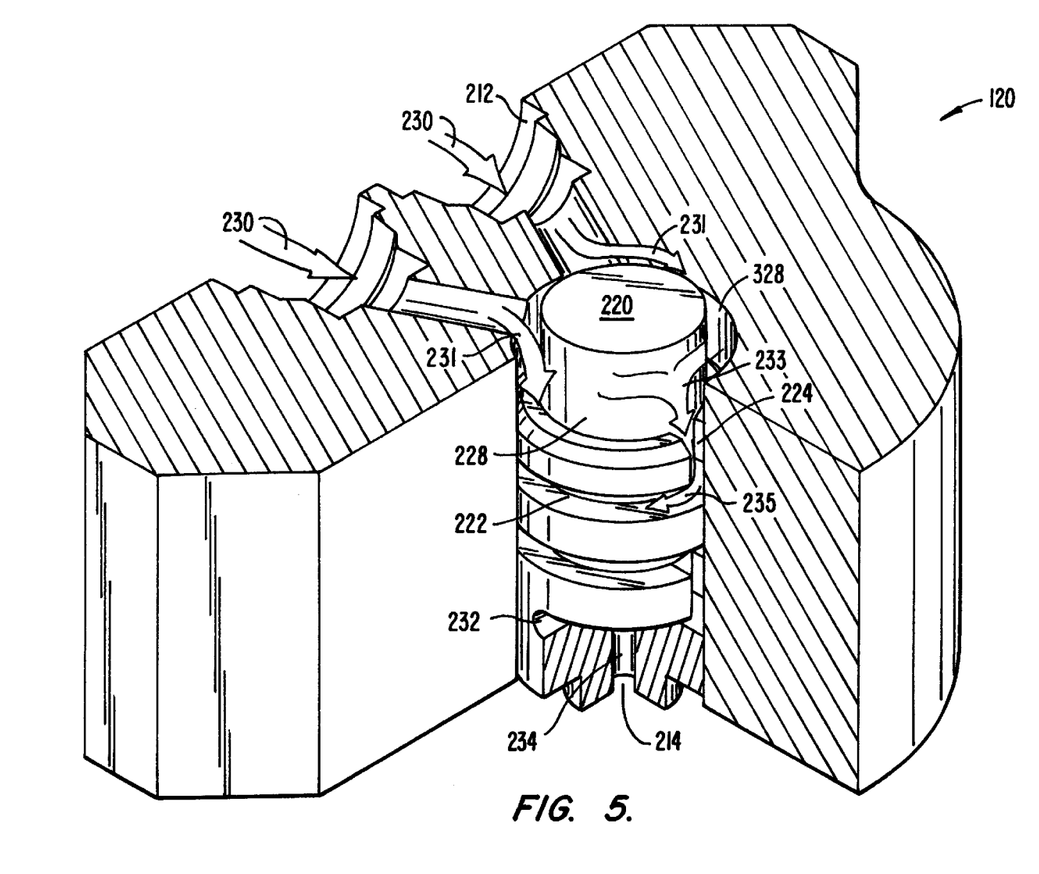
FIG. 5 depicts a further perspective cross-section and cut away view of the gas-mixing apparatus of FIG. 4A with the insert in place.

Referring to FIGS. 3–5, a gas mixing apparatus 120 of the present invention will now be described. Although the present invention describes the mixing of dichlorosilane and tungsten hexafluoride, it should be. understood that the present invention may be used to mix a plurality of other fluids for use in a semiconductor processing system. In one embodiment (shown in FIG. 3), the gas mixing apparatus 120 is coupled to gas supply lines 118 and CVD chamber lid 200. The gas mixing apparatus 120 is typically positioned upstream of the CVD chamber 110. It should be noted that gas mixing apparatus 120 may be located in a variety of positions in the CVD system so long as gas mixing occurs prior to the introduction of process gases into the CVD processing chamber 110.

Combining process gases such as dichlorosilane and tungsten hexafluoride in a gas mixing apparatus 120 upstream of the deposition chamber 110 results in a more uniform gas mixture or mixed gas being introduced into the deposition zone. By "upstream", it is meant that the mixing apparatus 120 is before, though not necessarily at a distance from, the deposition chamber 110. Preferably, the gas mixing apparatus 120 is located on the chamber lid 200 to provide a compact and integrated configuration for the CVD system 100. Locating gas apparatus 120 just prior to flowing the gases into the processing chamber 110 reduces the risk of gas phase reaction which may result when the mixed gas travels a long path to reach the processing chamber. Further, locating the gas mixing apparatus 120 on the chamber lid 200 provides for conduction-based cooling of the apparatus since the chamber lid 200 is typically liquid cooled to prevent ambient heat from the processing chamber 110 from affecting process gases upstream of the chamber. As mentioned, however, the gas mixing apparatus 120 may be located away from the processing chamber 110. The distance of the apparatus 120 upstream from the chamber 110 varies depending on the types of process gases used and is typically empirically determined.

FIGS. 4A–4C depict one embodiment of a gas mixing apparatus 120 of the present invention in further detail. The gas mixing apparatus 120 comprises a housing 210 having at least one gas inlet 212 and a gas outlet 214 which is more clearly shown in FIG. 4C and FIG. 5. The gas mixer housing 210 may have a plurality of gas inlets 212 for receiving gas from a desired number of gas sources fluidly coupled to the gas mixing apparatus 120. Preferably, the plurality of gas inlets 212 are located adjacent one another on a generally parallel plane so as to provide a compact and integrated configuration to facilitate gas line connection to the gas mixing apparatus 120. It should be noted that, although the figures depict a plurality of gas inlets 212, the gas mixing apparatus 120 may use a single gas inlet 212. The mixing apparatus 120 may also be used to mix a plurality of gas flows of the same gas which may, for example, be at different temperatures to obtain a resulting mixture having an intermediate temperature.

As shown in FIG. 4B, each gas inlet 212 may have a stepped, reduced diameter configuration so as to accommodate an elastomeric O-ring (not shown) or other sealing device to prevent gas leakage at the inlet. These gas inlets 212 eventually combine with other gas inlets in a common chamber 216 or combine into a single gas feed line (not shown) upstream of the deposition chamber 110. The gas feed line or the common chamber 216 is fluidly coupled.to a fluid flow channel 218 contained within gas mixer housing 210.

Referring to FIGS. 4A and 4B, the fluid flow channel 218 is provided in some manner with the gas mixing housing 210. The channel 218 may be formed on the housing, on an insert 220 with fits within the housing, or provided in some other manner within the housing. It should be understood that it is the fluid flow channel 218 that provides the majority of the gas mixing capability of the gas mixing apparatus 120.

In one embodiment of the gas mixing apparatus 120, the apparatus 120 is provided with an insert 220 which is removably housed within gas mixer housing 210 in an insert recess or common chamber 216. The insert 220 has a fluid flow channel 218 ted into the insert. Preferably, the channel 218 is located on the surface of the insert 220, although the channel may alternatively be formed within the insert. The fluid flow channel 218 typically comprises a plurality of carrier channels 222 connected by impinging channels 224. The fluid flow channel 218 may also include an annular inlet channel 228 (FIG. 5). As discussed in more detail below, these carrier channels 222, impinging channels 224, and inlet channel 228 act as fluid separators and fluid collectors. The fluid flow channel 218 formed on the insert are between about 0.5 to 0.01 inches in depth and about 0.5 to 0.01 inches in width, preferably about 0.1 inches in depth and 0.1 inches in width. Other sizes may be used as well, depending on the amount of gas to be mixed.

Figure 7A:
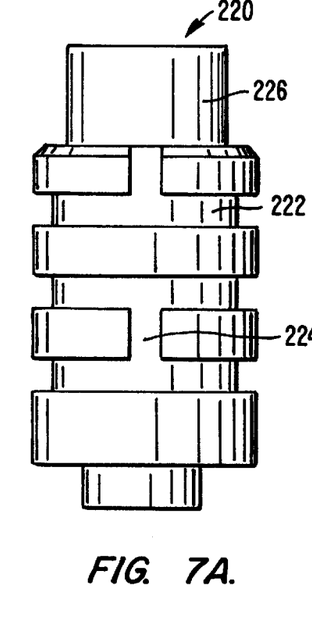
FIGS. 7A–D are a series of side views and an end view of the insert of FIG. 4A.

In a preferred embodiment, the insert 220 has a plurality of annular carrier channels 222 each axially aligned along a longitudinal axis of the insert 220. The plurality of generally annular carrier channels 222 are fluidly coupled to one another by impinging channels 224. These impinging channels 224 preferably perpendicularly intersect carrier channels 222, although other orientations are acceptable so long as sufficient turbulence is generated when gas flows are directed from the carrier channel into the impinging channel (see below). Typically, the low pressure created by the vacuum system 117 coupled to the CVD chamber 110 will draw the gas portions through the various channels of the mixing apparatus 120 towards the chamber. The locations of the impinging channels 224 joining together different sets of carrier channels 222 are typically varied along the longitudinal length of insert 220. These impinging channels 224, as shown more clearly in FIG. 7A, may be located about 180 degrees apart for one another to ensure that the gas portions travel the length of each carrier channel 222 before intersecting another impinging channel 224 and moving to the next carrier channel. It should be noted that the impinging channels 224 may assume other positions on the insert 220 so long as the impinging channels create the desired level of turbulence and mixing. The insert 220 also has a stem 226 which forms an annular inlet channel 228 (FIG. 5) with the chamber 216.

Referring to FIG. 5, as the gases travel through the fluid flow channel 218 (FIG. 4A) within the gas mixing apparatus 120, gases are forced in a controlled manner to repeatedly separate and merge with one another along the fluid flow channel prior to exiting at outlet 214. As gas flow denoted by arrows 230 enter the gas mixing apparatus 120, the gas flow is forced through around the stem 226 of the insert 220 as denoted by arrows 231. The gases travel along the annular inlet channel 228 and collide at arrow 233, being drawn into and forced through an impinging channel 224. Gas flow exiting the impinging channel 224 is separated into at least two gas portions by a surface of the annular carrier channel 222, as denoted by arrows 235 (see also FIG. 6). The a carrier channel 222 acts as a fluid separator. The gas portions typically travel through a plurality of annular carrier channels 222 and their corresponding impinging channels 224 in order to exit the gas mixing apparatus 120.

Figure 6:
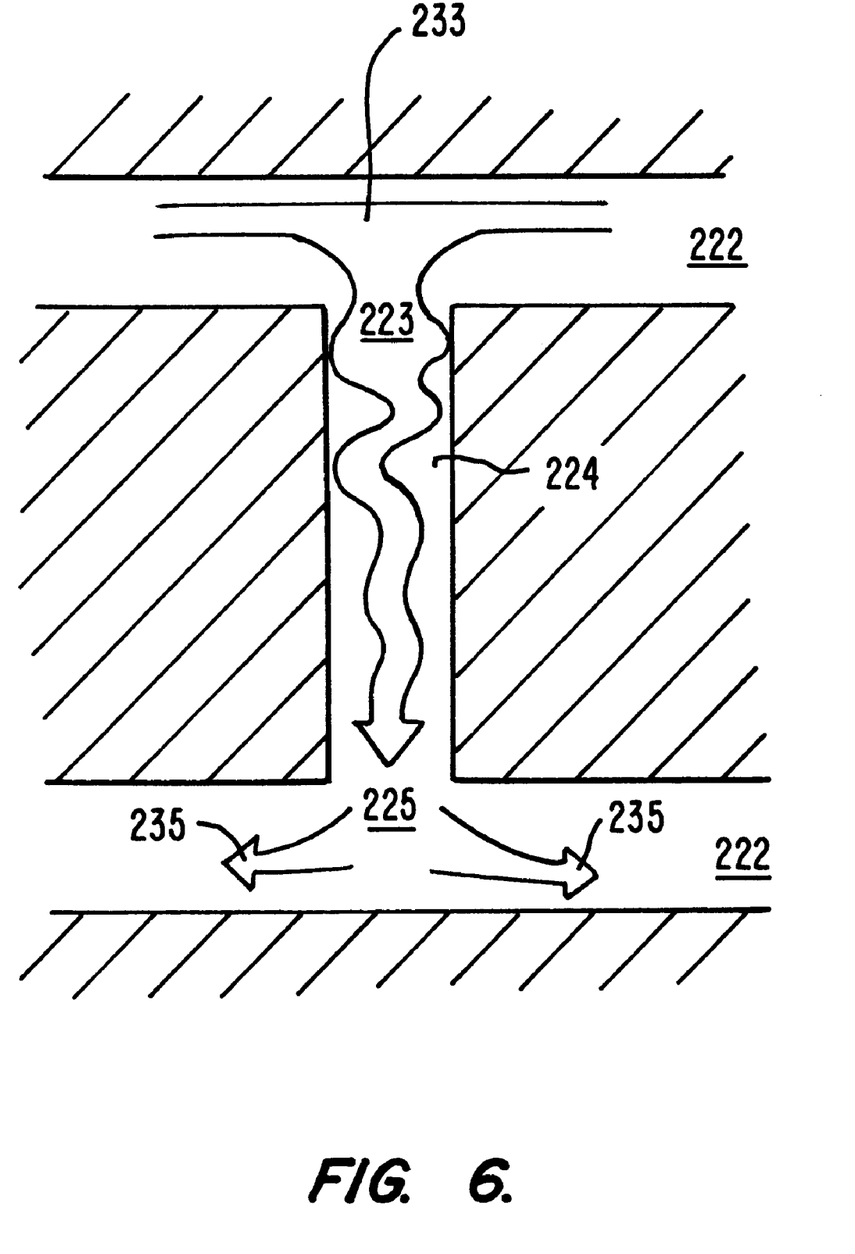
FIG. 6 is a schematic illustration of gas flow within a fluid flow channel of the present invention.

As shown more clearly in FIG. 6, the impinging channel 224 is located at a position along the carrier channel 222 to function as a fluid collector. Turbulence is created at these juncture sites between two types of channels. It is the separation, collision, and/or turbulence formed by the fluid flow channel 218 that facilitates the formation of a thorough gas mixture. Flow irregularities and turbulence are likely to exist at impinging channel entry point 223 and exit point 225 where impinging channel 224 intersects two annular carrier channels 222. After the gas portions are brought together, as denoted by arrow 233, and passed through impinging channel 224, the gas flow is again separated into a plurality of gas portions 235. The gas portions typically flow through another carrier channel 222 where the portions are again collided together and brought through an impinging channel 224.

The number of annular carrier channels 222 and impinging channels 224 is typically determined through empirical testing of various inserts and fluid flow channel configurations. Generally, the more impinging channels and carrier channels along the fluid flow path, the more thorough the gas mixing will be. Unfortunately, although it is desirable to have a long flow path having a large number of.turns and impinging channels, it is undesirable to have a flow path that is so long that gas phase reaction may occur between the plurality of gases in the mixing apparatus 120 prior to injection of the mixed gas into the CVD processing chamber 110. Gas phase reaction typically creates small solid particles which are carried by the mixed gas onto the semiconductor wafer and destroy the desired uniform deposition pattern.

Figure 7B:
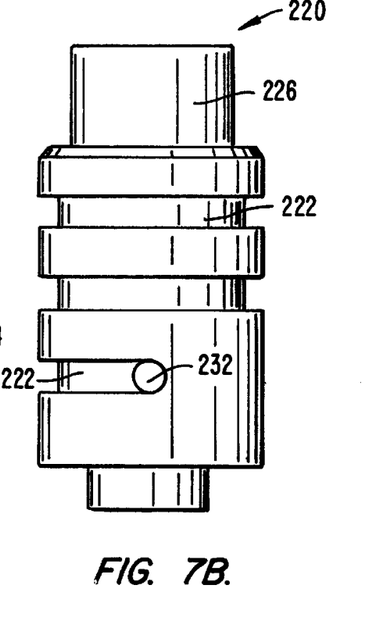
Figure 7C:
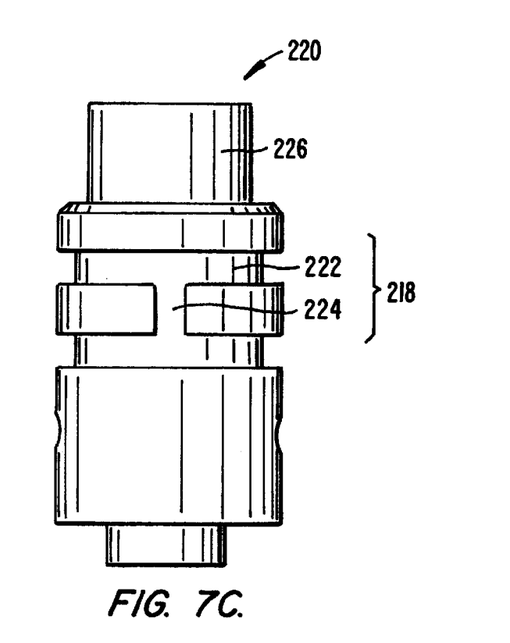
Figure 7D:
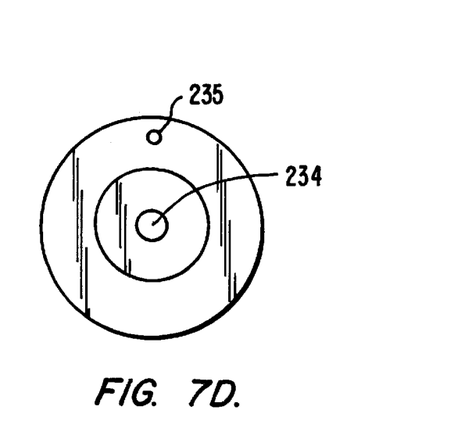

FIGS. 7A–7D depict one embodiment of the inert having three annular carrier channels 222 and three impinging channels 224 connecting the carrier channels and common chamber 216 (see FIG. 4B). As shown in FIG. 5 and FIG. 7B, the last annular carrier channel 222 terminates in a pair of fluid holes 232 drilled along a transverse axis of the insert 220. This fluid hole 232 leads to a central bore 234 formed along a longitudinal axis of the insert as shown in FIG. 5 and FIG. 7D. More gas mixing occurs as the gas portions from the holes 232 collide as they enter the central bore 234. The central bore 234 leads to gas outlet 214 which is fluidly coupled to the processing chamber 110. A positioning mark 235 is positioned on a lower surface of the insert 220 near the gas outlet 214 to properly align the insert in the housing 210.

Figure 8:
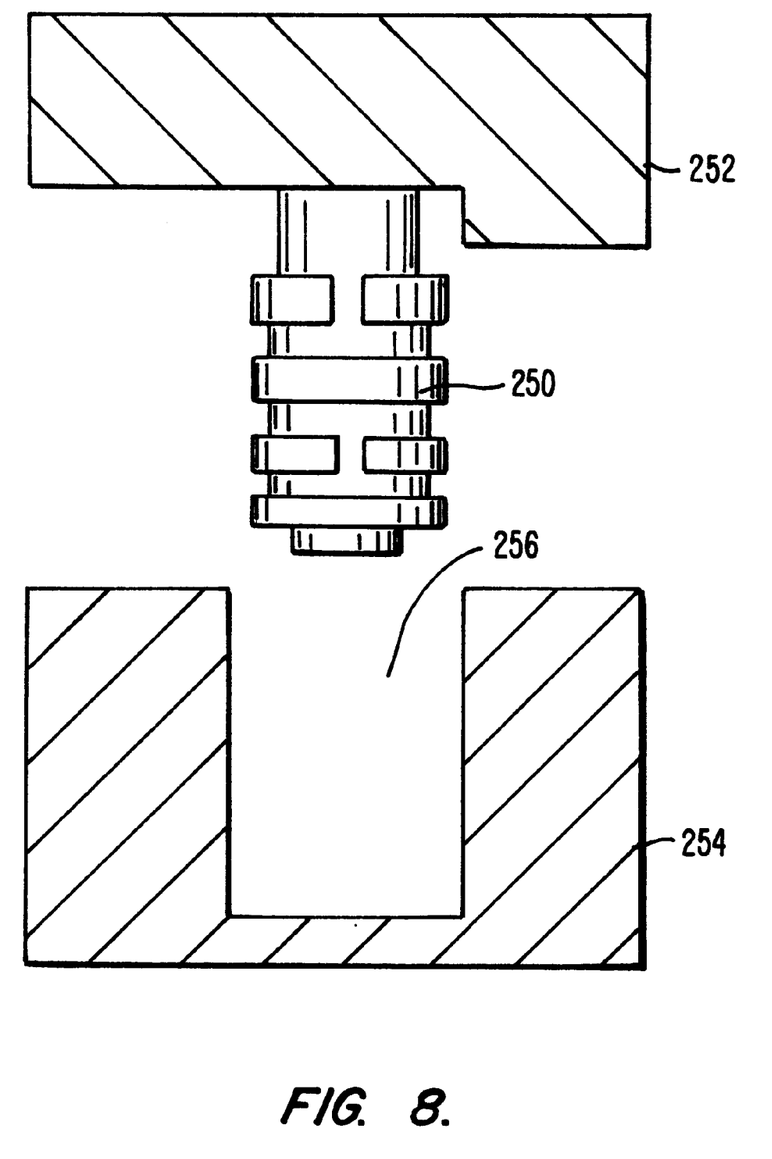
FIG. 8 shows a side cross-section of an alternate embodiment of the gas mixing apparatus of the present invention.

The insert 220 as shown in FIGS. 4–7 is typically removably inserted into the gas mixer housing 210. To ensure that gas passes through the fluid flow channels 218 formed on the insert 220, tight manufacturing tolerances between about ±0.0010 inches, preferably between about ±0.0005 inches, are maintained to ensure that the insert forms a relatively tight seal with the walls of chamber 216 (FIG. 4B). The insert of this embodiment is generally a free floating element that is slidably contained within the housing 210. Alternatively, as shown in FIG. 8, the insert may be formed as a protrusion 250 on an upper portion 252 of the gas mixing apparatus 120 which is coupled to lower portion 254 of the gas mixing apparatus. The lower portion 254 has a protrusion recess 256 for receiving the protrusion 254. This alternate embodied creates a configuration where all parts of the gas mixing apparatus, including the insert 250, are fastened or connected to one another and not free floating.

In preferred embodiments of the gas mixing apparatus, the housing 120, the insert 220, and other portions of the gas mixing apparatus are formed from aluminum, aluminum alloy, or nickel. The surfaces in contact with the plurality of gases may also be electropolished to remove undesired surface irregularities along the fluid flow path. It should be understood that a plurality of materials may be used to form the gas mixing apparatus 120 so long as the material used is resistant to reaction and deposition with process and cleaning gasses used with the gas mixing apparatus 120. Further, central bore 234 may extend through the entire length of the insert 220 so that the cleaning gasses may be injected directly into the processing chamber 110 without passing through the fluids flow channel 218 used for gas mixing. This may be beneficial if it is undesirable to expose the fluid flow channel to cleaning gases. Alternatively the cleaning gas may bypass the gas mixing apparatus 120 entirely and be directly injected to the processing chamber 110. The present invention provides improved inspection capability since the fluid flow channel 218 is located on insert 220 which may be easily removed and inspected.

Figure 9:
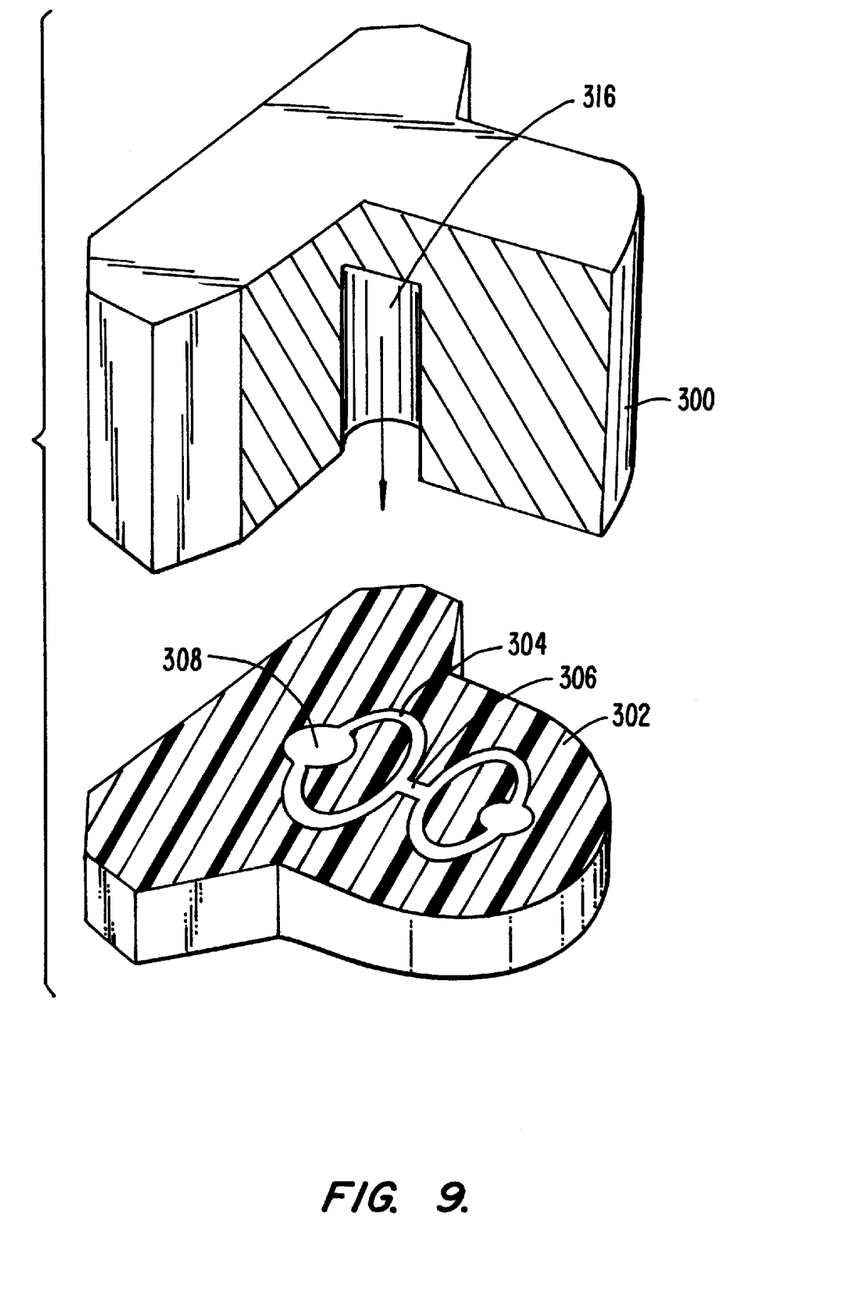
FIG. 9 is a perspective cut away view of a further alternate embodiment of the gas mixing apparatus.

An alternate embodiment of the gas mixing apparatus shown in FIG. 9, depicts a gas mixing apparatus 120 having a housing that comprises a first, upper portion 300 and a second, lower portion 302. The housing has a chamber 316 which is fluidly coupled to a plurality of gas sources, and leads to a fluid flow channel formed in the lower portion of the gas mixing apparatus. The fluid flow channel 218 in the lower portion 302 comprises a plurality of circular or elliptical carrier channels 304 connected by at least one impinging channel 306. Gas flowing from chamber 360 is forced into receptor 308 which distributes the gas along the carrier channels and impinging channels. As a further alternative, the fluid flow channel 218 may be formed directly on a bottom surface (not shown) of the housing 210. The bottom surface then rests against the chamber lid 200 which acts to enclose the fluid flow channel 218. Gas is forced to flow through the channel 218 on the bottom surface of the housing 210 and then into the CVD processing chamber 110.

Figure 10:
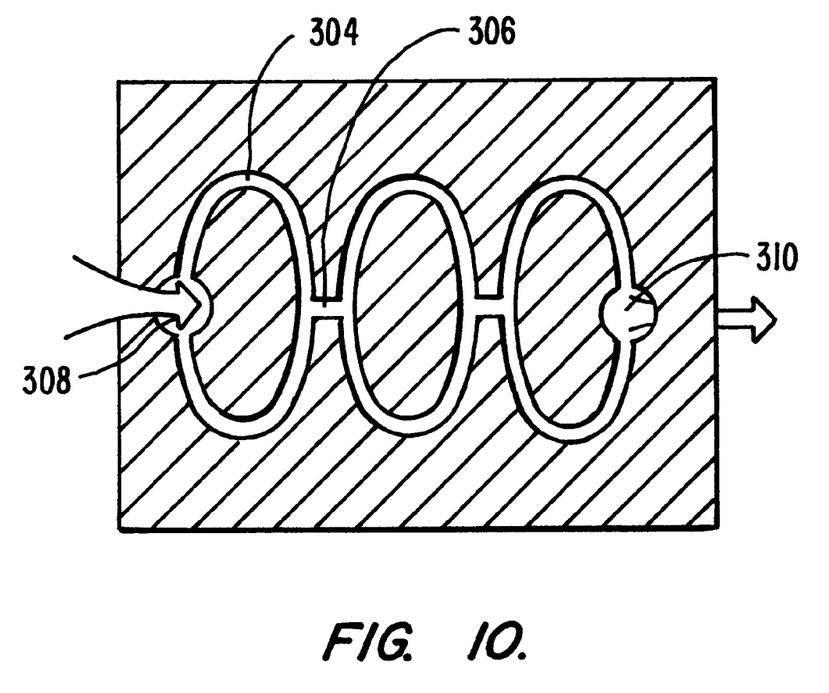
FIG. 10 is a schematic illustration of an alternate fluid flow channel for use with the gas mixing apparatus of FIG. 9.

As shown in FIG. 10 a plurality of elliptical or otherwise closed path carrier channels 304 may be used or connected in series by impinging channels 306 to form the desired fluid flow mixing pathway of the gas mixing apparatus. The resulting gas mixture or mixed gas exits through gas outlet 310 and into the processing chamber 110. This alternate embodiment is also separable to provide inspection of the fluid flow channel 218. Having the fluid flow channel 218 on a separable piece such as insert 220 or second, lower portion 302 simplifies the manufacturing of the gas mixing apparatus 120. This quality also facilitates the detection of defective parts prior to installation of a gas mixing apparatus with a semiconductor processing system. It should be understood that, so long as a plurality of gas portions are brought together and then separated in a typically repeating fashion, a variety of different fluid flow channel configurations may be used to achieve the desired level of gas mixing.

A method for fabricating an integrated circuit by using the gas mixing apparatus 120 of the present invention will now be described in detail. Integrated circuit devices are typically formed from semiconductor wafers which may be processed using the present invention. Various layers of dielectric material, insulating material, or metal are selectively deposited upon the semiconductor wafer to provide desired device characteristics. The method comprises the step of providing a processing chamber for such chemical deprivation deposition. The method also comprises providing a gas mixing apparatus for thoroughly mixing a plurality of sources gases as needed for various types of deposition procedures. A semiconductor wafer is typically introduced into the chamber and preferably brought to a desired processing temperature. Process gasses to be introduced into the chamber are then premixed upstream of the CVD processing chamber in order to achieve a more through deposition on the wafer. Process gases are thoroughly mixed by forcing fluid flows from a plurality of gases, such as tungsten hexafluoride and dichlorosilane, together and then separating the flows in a typically repeated fashion until a thorough gas mixture is formed. The resulting mixed gas is introduced into the processing chamber 110 at a reaction zone over the semiconductor wafer whereby either a thermal or plasma process causes the mixed gas to decompose and deposit the desired material onto the wafer substrate.

While the above is a full description of the specific embodiments, various modifications, alternative constructions and equivalents may be used. For example, it should be noted that the invention is not limited to a single wafer chamber as described above and shown in the enclosed drawings. For example, the gas mixing apparatus of the present invention could be installed with a batch chamber that simultaneously processes a plurality of wafers. In addition, the invention would be suitable for use with a multi-wafer chamber that sequentially performs individual processing steps on each of the wafers. Therefore, the above description and illustrations should not be. taken as limiting the scope of the present invention defined by the appended claims.

What is claimed is:

1. A method for fabricating an integrated circuit device, said method comprising the steps of:

flowing a plurality of gases into a gas mixture apparatus;

separating the plurality of gases into two or more gas portions;

colliding the gas portions with each other to form a mixed gas;

flowing the mixed gas into the processing chamber onto a semiconductor wafer; and heating said mixed gas within the chamber to form a layer of deposition material on the semiconductor wafer.

2. The method of claim 1 wherein said plurality of gases comprises tungsten hexafluoride and dichlorosilane.

3. A method for fabricating an integrated circuit device, said method comprising the steps of:

flowing a plurality of gases into a gas mixture apparatus;

separating the plurality of gases into two or more gas portions;

colliding the gas portions with each other to form a mixed gas; and flowing the mixed gas into the processing chamber onto a semiconductor wafer;

wherein the separating step and colliding step are repeated a plurality of times before the mixed gas is introduced into the processing chamber.

4. The method of claim 3 wherein said plurality of gases comprises tungsten hexafluoride and dichlorosilane.

5. A method for fabricating an integrated circuit device, said method comprising the steps of:

flowing a plurality of gases into a gas mixture apparatus;

separating the plurality of gases into two or more gas portions;

colliding the gas portions with each other to form a mixed gas; and flowing the mixed gas into the processing chamber onto a semiconductor wafer;

wherein said separating step comprises:

forcing a gas flow against a surface of a fluid separator; and redirecting said gas flow into a plurality of gas portions flowing away from one another.

6. A method for fabricating an integrated circuit device, said method comprising the steps of:

flowing a plurality of gases into a gas mixture apparatus;

separating the plurality of gases into two or more gas portions;

colliding the gas portions with each other to form a mixed gas; and flowing the mixed gas into the processing chamber onto a semiconductor wafer;

wherein said colliding step comprises:

collecting the two or more gas portions with a fluid collector; and combining the two or more gas portions together in a turbulent manner to form a mixed gas within said fluid collector.

7. The method of claim 6 wherein the colliding step further comprises releasing the mixed gas from the fluid collector into a fluid separator.

8. A method for mixing a plurality of gases, the method comprising:

introducing a flow of gases into a fluid flow channel including one or more fluid separators and one or more fluid collectors;

separating the gases into a plurality of gas portions using the one or more fluid separators in the fluid flow channel; and directing the plurality of gas portions to approach from substantially opposite directions in the one or more fluid collectors and collide with each other to combine the gas portions into a mixed gas.

9. The method of claim 8 wherein the fluid flow channel lies generally on a plane.

10. The method of claim 8 wherein separating the gases comprises introducing the flow of gases into a first carrier channel of the fluid flow channel, the first carrier channel having a channel surface separating the flow of gases into a plurality of gas portions flowing away from each other in the first carrier channel.

11. The method of claim 10 wherein directing the plurality of gas portions comprises introducing the plurality of gas portions from the first carrier channel to a first impinging channel which intersects the first carrier channel at a location where the plurality of gas portions approach from substantially opposite directions and collide with each other.

12. The method of claim 11 wherein the first impinging channel is generally, perpendicular to the first carrier channel.

13. The method of claim 12 wherein the first impinging channel is generally axial and the first carrier channel lies generally on a plane perpendicular to the impinging channel.

14. The method of claim 11 wherein the first impinging channel and the first carrier channel lie generally on a plane.

15. The method of claim 11 wherein separating the gases further comprises introducing the collided gases from the first impinging channel into a second carrier channel for separating the collided gases from the first impinging channel into a plurality of gas portions flowing away from each other in the second carrier channel.

16. The method of claim 15 wherein directing the plurality of gas portions further comprises introducing the plurality of gas portions from the second carrier channel to a second impinging channel which intersects the second carrier channel at a location where the plurality of gas portions approach from substantially opposite directions and collide with each other.

17. The method of claim 16 wherein the first and second impinging channels and the first and second carrier channels lie generally on a plane.

18. The method of claim 16 wherein the first and second impinging channels are generally axial, and the first and second carrier channels each lie generally on a plane which is perpendicular to the impinging channels, the first and second carrier channels being axially spaced from one another.

19. The method of claim 18 wherein the second impinging channel is circumferentially spaced from the first impinging channel by about 180°.

20. The method of claim 10 wherein the first carrier channel is generally annular.

21. A method for mixing a plurality of gases, the method comprising:

introducing a flow of gases into a fluid flow channel including at least one carrier channel, each carrier channel lying generally on a plane for separating the gases into a plurality of gas portions flowing away from each other in the carrier channel, the fluid flow channel further including at least one impinging channel intersecting the at least one carrier channel at a location where the plurality of gas portions collide with each other;

separating the gases into a plurality of gas portions in the at least one carrier channel; and directing the plurality of gas portions to collide with each other at the intersection between the at least one impinging channel and the at least one carrier channel to combine the gas portions into a mixed gas.

22. The method of claim 21 wherein the at least one carrier channel and the at least one impinging channel are generally coplanar.

23. The method of claim 21 wherein the impinging channel is generally perpendicular to the plane on the carrier channel generally lies.

* * * * *